(12) United States Patent
Liu et al.

(10) Patent No.: US 8,108,160 B2
(45) Date of Patent: Jan. 31, 2012

(54) METHOD AND SYSTEM FOR DETERMINING A STATE OF CHARGE OF A BATTERY

(75) Inventors: Wei Liu, Warren, MI (US); Michael J. Gielniak, Atlanta, GA (US); Jian Lin, Beverly Hills, MI (US); Brian Koch, Berkley, MI (US); Damon R. Frisch, Troy, MI (US); Joseph M. Lograsso, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 389 days.

(21) Appl. No.: 12/238,204

(22) Filed: Sep. 25, 2008

(65) Prior Publication Data

US 2010/0076704 A1    Mar. 25, 2010

(51) Int. Cl.
*H02J 7/00* (2006.01)
(52) U.S. Cl. ............ 702/63; 702/57; 320/132; 320/150; 324/426; 324/427; 324/428; 324/429; 324/430; 324/431; 324/432; 324/433; 324/434; 324/435; 324/436; 324/437

(58) Field of Classification Search .................... 702/57, 702/63; 320/132, 150; 324/426–437
See application file for complete search history.

(56) References Cited

U.S. PATENT DOCUMENTS

| | | | |
|---|---|---|---|
| 6,359,419 B1 | 3/2002 | Verbrugge et al. | |
| 6,639,385 B2 | 10/2003 | Verbrugge et al. | |
| 2004/0162683 A1 | 8/2004 | Verbrugge et al. | |
| 2005/0154544 A1 * | 7/2005 | Ono | 702/63 |

* cited by examiner

*Primary Examiner* — Sujoy Kundu
(74) *Attorney, Agent, or Firm* — Ingrassia Fisher & Lorenz, P.C.

(57) ABSTRACT

Methods and systems for determining a state of charge of a battery are provided. A first component of the state of charge is calculated based on a first property of the battery. A second component of the state of charge is calculated based on a second property of the battery. The first component of the state of charge is weighted based on a rate of change of the first property relative to a change of the state of charge. The second component of the state of charge is weighted based on a rate of change of the second property relative to a change of the state of charge. The state of charge is determined based on the first and second weighted components.

20 Claims, 10 Drawing Sheets

| SOC | Voc@0C | Voc@25C |
|---|---|---|
| 0 | 3.029 | 3.0668 |
| 0.05 | 3.079788 | 3.113332 |
| 0.1 | 3.122682 | 3.153013 |
| 0.15 | 3.158405 | 3.186437 |
| 0.2 | 3.187677 | 3.214196 |
| 0.25 | 3.21122 | 3.236884 |
| 0.3 | 3.229757 | 3.255095 |
| 0.35 | 3.244008 | 3.269421 |
| 0.4 | 3.254694 | 3.280456 |
| 0.45 | 3.262539 | 3.288793 |
| 0.5 | 3.268263 | 3.295025 |
| 0.55 | 3.272587 | 3.299746 |
| 0.6 | 3.276234 | 3.303548 |
| 0.65 | 3.279924 | 3.307025 |
| 0.7 | 3.28438 | 3.310771 |
| 0.75 | 3.290323 | 3.315378 |
| 0.8 | 3.298475 | 3.32144 |
| 0.85 | 3.309557 | 3.32955 |
| 0.9 | 3.324291 | 3.340301 |
| 0.95 | 3.343398 | 3.354287 |
| 1 | 3.3676 | 3.3721 |

| SOC | Pi@25C | Pi@35C |
|---|---|---|
| 0 | 2.8849 | 3.8799 |
| 0.05 | 3.465055 | 4.359697 |
| 0.1 | 3.981078 | 4.824204 |
| 0.15 | 4.439057 | 5.273998 |
| 0.2 | 4.845082 | 5.709655 |
| 0.25 | 5.205239 | 6.131753 |
| 0.3 | 5.525618 | 6.540869 |
| 0.35 | 5.812306 | 6.937579 |
| 0.4 | 6.071393 | 7.322462 |
| 0.45 | 6.308965 | 7.696093 |
| 0.5 | 6.531113 | 8.05905 |
| 0.55 | 6.743922 | 8.41191 |
| 0.6 | 6.953483 | 8.75525 |
| 0.65 | 7.165883 | 9.089648 |
| 0.7 | 7.387211 | 9.415679 |
| 0.75 | 7.623555 | 9.733922 |
| 0.8 | 7.881002 | 10.04495 |
| 0.85 | 8.165643 | 10.34935 |
| 0.9 | 8.483563 | 10.64769 |
| 0.95 | 8.840853 | 10.94055 |
| 1 | 9.2436 | 11.2285 |

TABLE 1 EXAMPLE OF THE PRIME DOMINANT POLE POSITION VALUE

| SOC/TEMP | -45C° | -30C° | -20C° | -10C° | 0C° | 10C° | 20C° | 30C° | 40C° |
|---|---|---|---|---|---|---|---|---|---|
| 10% | -0.4 | -0.35 | -0.35 | -0.35 | -0.32 | -0.32 | -0.30 | -0.30 | -0.30 |
| 20% | -0.3 | -0.3 | -0.3 | -0.3 | -0.28 | -0.27 | -0.25 | -0.25 | -0.25 |
| 30% | -0.29 | -0.25 | -0.25 | -0.25 | -0.24 | -0.22 | -0.21 | -0.21 | -0.21 |
| 40% | -0.27 | -0.21 | -0.21 | -0.21 | -0.22 | -0.20 | -0.18 | -0.18 | -0.18 |
| 50% | -0.25 | -0.19 | -0.19 | -0.19 | -0.20 | -0.18 | -0.16 | -0.16 | -0.16 |
| 60% | -0.22 | -0.17 | -0.17 | -0.17 | -0.17 | -0.16 | -0.15 | -0.15 | -0.15 |
| 70% | -0.18 | -0.15 | -0.15 | -0.15 | -0.16 | -0.15 | -0.14 | -0.14 | -0.14 |
| 80% | -0.22 | -0.16 | -0.16 | -0.16 | -0.17 | -0.16 | -0.15 | -0.15 | -0.15 |
| 90% | -0.25 | -0.17 | -0.17 | -0.17 | -0.18 | -0.17 | -0.16 | -0.16 | -0.16 |
| 100% | -0.27 | -0.18 | -0.18 | -0.18 | -0.20 | -0.18 | -0.18 | -0.18 | -0.18 |

*FIG. 14*

TABLE 2 EXAMPLE OF THE SECOND DOMINANT POLE POSITION VALUE

| SOC/TEMP | -45C° | -30C° | -20C° | -10C° | 0C° | 10C° | 20C° | 30C° | 40C° |
|---|---|---|---|---|---|---|---|---|---|
| 10% | -1.25 | -1.15 | -1.05 | -1.05 | -0.95 | -0.95 | -0.95 | -0.95 | -0.92 |
| 20% | -1.15 | -1.05 | -1.0 | -1.0 | -0.93 | -0.93 | -0.93 | -0.93 | -0.90 |
| 30% | -1.09 | -0.95 | -0.97 | -0.97 | -0.90 | -0.90 | -0.90 | -0.90 | -0.88 |
| 40% | -1.08 | -0.90 | -0.95 | -0.95 | -0.88 | -0.88 | -0.88 | -0.88 | -0.86 |
| 50% | -0.95 | -0.88 | -0.91 | -0.91 | -0.86 | -0.86 | -0.86 | -0.86 | -0.84 |
| 60% | -0.90 | -0.85 | -0.88 | -0.88 | -0.84 | -0.84 | -0.84 | -0.84 | -0.83 |
| 70% | -0.87 | -0.80 | -0.85 | -0.85 | -0.80 | -0.80 | -0.80 | -0.80 | -0.81 |
| 80% | -0.90 | -0.83 | -0.88 | -0.88 | -0.83 | -0.83 | -0.83 | -0.83 | -0.84 |
| 90% | -0.93 | -0.90 | -0.90 | -0.90 | -0.86 | -0.86 | -0.86 | -0.86 | -0.86 |
| 100% | -0.95 | -0.95 | -0.95 | -0.95 | -0.88 | -0.88 | -0.88 | -0.88 | -0.88 |

*FIG. 15*

METHOD AND SYSTEM FOR DETERMINING A STATE OF CHARGE OF A BATTERY

TECHNICAL FIELD

The present invention generally relates to electrochemical power sources, such as batteries, and more particularly relates to methods and systems for determining the state of charge of a battery.

BACKGROUND OF THE INVENTION

In recent years, advances in technology, as well as ever-evolving tastes in style, have led to substantial changes in the design of automobiles. One of the changes involves the complexity, as well as the power usage, of the various electrical systems within automobiles, particularly alternative fuel vehicles, such as hybrid, electric, and fuel cell vehicles.

Such vehicles often use electrochemical power sources, such as batteries, ultracapacitors, and fuel cells, to power the electric motors that drive the wheels, sometimes in addition to another power source, such as an internal combustion engine. An important parameter in the operation of vehicles that utilize batteries is the "state of charge" (SOC). The state of charge refers to the amount of stored energy in the battery that is available to be used at any given time relative to the amount of stored energy that is available when the battery is fully charged. An accurate determination of the state of charge allows for the vehicles to maximize performance and fuel economy and/or minimize emissions.

In automotive applications, a conventional approach for batteries is to relate either a measured or calculated open circuit voltage to the state of charge. This is feasible because the open circuit voltage, which is the resting voltage of the battery when no load is applied and dynamics is gone, generally exhibits some observable dependence on the battery's state of charge. There are batteries, however, such as nickel metal hydride and some types of lithium ion batteries, such as lithium iron phosphate batteries (e.g., nanophosphate lithium ion batteries), which possess a nearly constant open circuit voltage across most of the range of state of charge. In other words, the open circuit voltage reveals little about the state of charge of the battery. For example, in some nanophosphate lithium ion batteries, increases in the state of charge from 0% to 100% results in only a 7% change in the open circuit voltage.

Therefore, while these batteries are highly desirable as power sources for electric and hybrid electric vehicles because of their low mass, high power capability, and large energy storage capacity, they present a problem with regard to control because it is very difficult to estimate their state of charge with any degree of certainty in automotive applications.

Other techniques have also been used to determine the state of charge of batteries, such as ampere-hour (Ah) counting and electrochemical impedance spectroscopy (EIS). However, they too have drawbacks due to, for example, accuracy and/or high implementation costs.

Accordingly, it is desirable to provide a method and a system for determining the state of charge of a battery that combines several methods in such a way to maximize the usefulness of each. Furthermore, other desirable features and characteristics of the present invention will become apparent from the subsequent detailed description and the appended claims, taken in conjunction with the accompanying drawings and the foregoing technical field and background.

SUMMARY OF THE INVENTION

A method for determining a state of charge of a battery is provided. A first component of the state of charge is calculated based on a first property of the battery. A second component of the state of charge is calculated based on a second property of the battery. The first component of the state of charge is weighted based on a rate of change of the first property relative to a change of the state of charge. The second component of the state of charge is weighted based on a rate of change of the second property relative to a change of the state of charge. The state of charge is determined based on the first and second weighted components.

A method for determining a state of charge of a battery is provided. First and second properties of the battery are calculated. A first component of the state of charge is calculated based on the first property of the battery. A second component of the state of charge is calculated based on the second property of the battery. The first component of the state of charge is weighted proportionally to a rate of change of the first property relative to a change of the state of charge. The second component of the state of charge is weighted proportionally to a rate of change of the second property relative to a change of the state of charge. The state of charge is determined based on the first and second weighted components.

An automotive drive system is provided. The automotive drive system includes an electric motor, a battery coupled to the electric motor, a sensor assembly coupled to the battery and configured to detect at least one characteristic of the battery and generate signals representative thereof, and a processor in operable communication with the sensor assembly. The processor is configured to receive the signals from the sensor assembly, calculate first and second components of a state of charge of the battery based on the signals, weight the first and second components of the state of charge proportionally to respective rates of change of the first and second properties relative to a change in the state of charge of the battery, and determine the state of charge of the battery based on the first and second weighted components.

DESCRIPTION OF THE DRAWINGS

The present invention will hereinafter be described in conjunction with the following drawing figures, wherein like numerals denote like elements.

FIGS. 14 and 15 are tables of prime and second dominant poles of the battery, respectively, at various states of charge.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The following description refers to elements or features being "connected" or "coupled" together. As used herein, "connected" may refer to one element/feature being directly joined to (or directly communicating with) another element/feature, and not necessarily mechanically. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment. It should also be understood that FIGS. 1-9 are merely illustrative and may not be drawn to scale.

FIG. 1 to FIG. 13 illustrate systems and methods for determining a state of charge of a battery. A first component of the state of charge is calculated based on a first property of the battery. A second component of the state of charge is calculated based on a second property of the battery. The first component of the state of charge is weighted based on a rate of change of the first property relative to a change of the state of charge. The second component of the state of charge is weighted based on a rate of change of the second property relative to a change of the state of charge. The state of charge is determined based on the first and second weighted components.

The weighting of each of the first and second components may increase as the rate of change of the first and second properties, respectively, increases relative to the change in the state of charge (i.e., as the "inverse slope" of the state of charge as a function of the property increases or becomes "flatter").

A third component may be calculated based on a third property of the battery and may be similarly weighted. The weighting of the third component may be an adjustable parameter.

Figure 1:
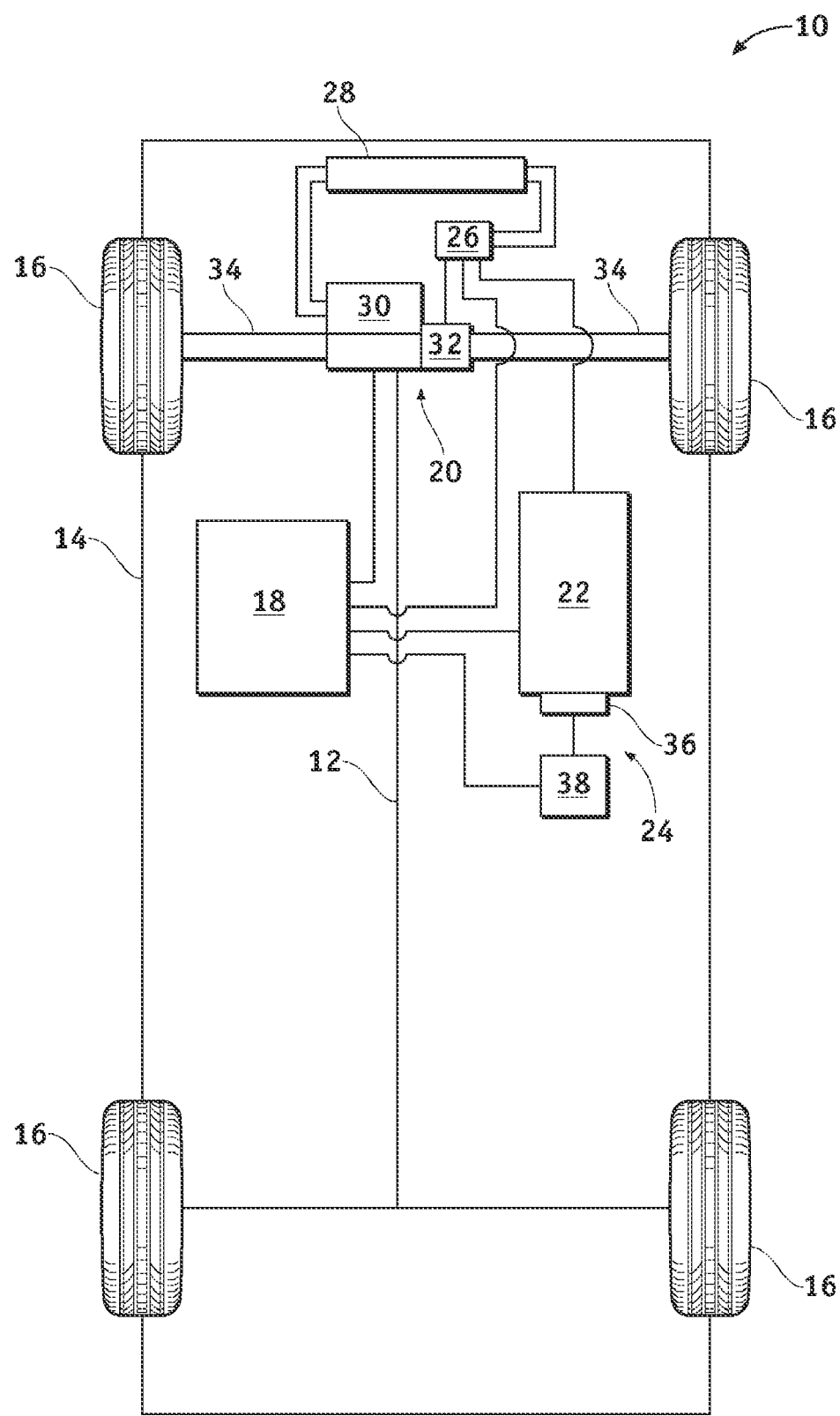
FIG. 1 is a schematic view of an exemplary automobile according to one embodiment of the present invention.

FIG. 1 illustrates a vehicle 10, or "automobile," according to one embodiment of the present invention. The automobile 10 includes a chassis 12, a body 14, four wheels 16, and an electronic control system 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD). The automobile 10 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, and an electric motor.

In the exemplary embodiment illustrated in FIG. 1, the automobile 10 is a hybrid electric vehicle (HEV), and further includes an actuator assembly 20, a battery 22, a state of charge (SOC) system 24, a power inverter assembly (or inverter) 26, and a radiator 28. The actuator assembly 20 includes a combustion engine 30 and an electric motor/generator (or motor) 32. As will be appreciated by one skilled in the art, the electric motor 32 includes a transmission therein, and although not illustrated also includes a stator assembly (including conductive coils), a rotor assembly (including a ferromagnetic core), and a cooling fluid (i.e., coolant). The stator assembly and/or the rotor assembly within the electric motor 32 may include multiple electromagnetic poles (e.g., sixteen poles), as is commonly understood.

Still referring to FIG. 1, and as described in greater detail below, the combustion engine 30 and the electric motor 32 are integrated such that one or both are mechanically coupled to at least some of the wheels 16 through one or more drive shafts 34. In one embodiment, the automobile 10 is a "series HEV," in which the combustion engine 30 is not directly coupled to the transmission, but coupled to a generator (not shown), which is used to power the electric motor 32. In another embodiment, the automobile 10 is a "parallel HEV," in which the combustion engine 30 is directly coupled to the transmission by, for example, having the rotor of the electric motor 32 rotationally coupled to the drive shaft of the combustion engine 30.

The battery 22 is electrically connected to the inverter 26 and, in one embodiment, is a lithium iron phosphate battery, such as a nanophosphate lithium ion battery, including a plurality of cells, as is commonly understood. Nanophosphate lithium ion batteries exhibit excellent power performance over a wide range of temperatures. One of the advantages of nanophosphate lithium ion batteries, in terms of power capability, is that the open circuit voltage is not sensitive to SOC. In one exemplary nanophosphate lithium ion battery, open circuit voltage varies only about 20 mv per 10% SOC change. Although such a property is beneficial with regards to vehicle performance, it causes technical challenges in determining the state of charge of the battery when using a voltage-based approach.

The SOC system 24 includes a sensor array 36 and a SOC module 38. Although not shown in detail, the sensor array 36 includes a current sensor, a voltage sensor, and a temperature sensor located adjacent to the battery 22 (or more particularly within the battery/inverter circuit shown in FIG. 2). The SOC module 38 is in operable communication with the sensor array 36 and in one embodiment includes at least one processor and/or a memory that includes data relating measured properties and system pole locations of the battery 22 to the state of charge of the battery 22, as is described in greater detail below. Although not illustrated as such, the SOC module 38 may be integral with the electronic control system 18 and may also include one or more power sources.

The radiator 28 is connected to the frame at an outer portion thereof and although not illustrated in detail, includes multiple cooling channels therein that contain a cooling fluid (i.e., coolant) such as water and/or ethylene glycol (i.e., "antifreeze") and is coupled to the engine 30 and the inverter 26.

Figure 2:
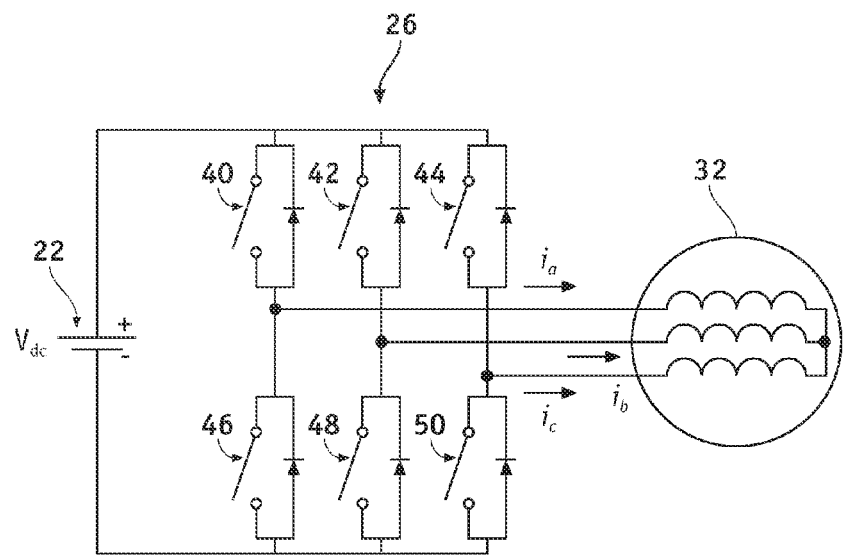
FIG. 2 is a schematic view of an inverter within the automobile of FIG. 1.

FIG. 2 illustrates the inverter 26 in greater detail. The inverter 26 includes a three-phase circuit coupled to the motor 32. More specifically, the inverter 26 includes a switch network having a first input coupled to a voltage source $V_{dc}$ (e.g., the battery 22) and an output coupled to the motor 32. Although a single voltage source is shown, a distributed direct current (DC) link with two series sources may be used. The switch network comprises three pairs (a, b, and c) of series switches with antiparallel diodes (i.e., antiparallel to each switch) corresponding to each of the phases of the motor 32. Each of the pairs of series switches comprises a first switch, or transistor, (i.e., a "high" switch) 40, 42, and 44 having a first terminal coupled to a positive electrode of the voltage source 22 and a second switch (i.e., a "low" switch) 46, 48, and 50 having a second terminal coupled to a negative electrode of the voltage source 22 and having a first terminal coupled to a second terminal of the respective first switch 40, 42, and 44.

Referring again to FIG. 1, the electronic control system 18 is in operable communication with the actuator assembly 20, the battery 22, the SOC system 24, and the inverter 26. Although not shown in detail, the electronic control system 18 (and/or the SOC module 38) includes various sensors and automotive control modules, or electronic control units (ECUs), such as a body control module (BCM), and at least one processor and/or a memory which includes instructions stored thereon (or in another computer-readable medium) for carrying out the processes and methods as described below.

During operation, still referring to FIG. 1, the automobile 10 is operated by providing power to the wheels 16 with the combustion engine 30 and the electric motor 32 in an alternating manner and/or with the combustion engine 30 and the electric motor 32 simultaneously. In order to power the electric motor assembly 30, DC power is provided from the battery 22 to the inverter 26, which converts the DC power to alternating current (AC) power, prior to energizing the electric motor 32.

According to one aspect of the present invention, the state of charge of the battery 22 is determined based on multiple components. Each of the components is calculated based on a property of the battery, such as current flow, a voltage, and a transient response. Each of the components is weighted based on a rate of change of the respective property relative to a change of the state of charge. The state of charge is the determined based on the weighted components (e.g., as a sum of the weighted components).

Figure 3:
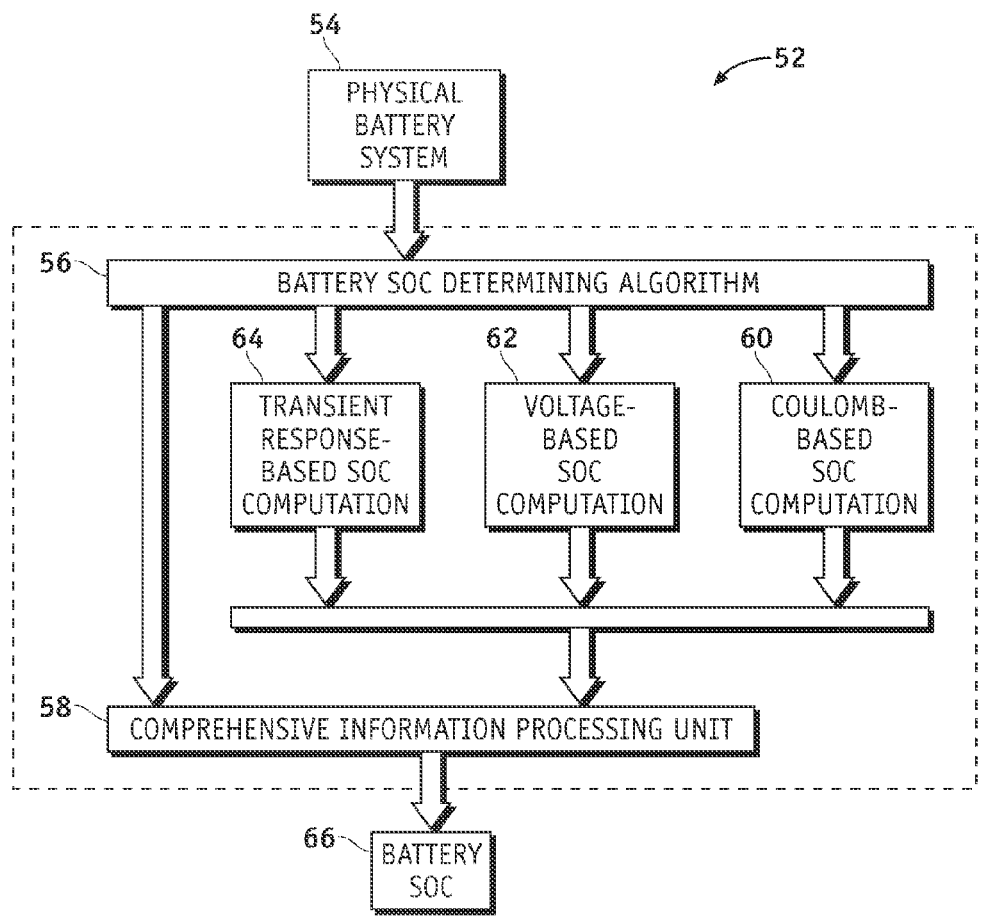
FIG. 3 is a block diagram of a system (and/or method) for determining a state of charge of a battery according to one embodiment of the present invention.

FIG. 3 is a block diagram of a system (and/or method) 52 for determining the state of charge of a battery, according to one embodiment of the present invention. The system 52 includes a battery system 54, an SOC determining algorithm 56, and an information processing unit 58. The battery system 54 includes, in one embodiment, the battery 22 and the SOC system 24 (FIG. 1). The SOC determining algorithm 56 and the information processing unit 58 may be functional components stored within the electronic control system 18 (and/or the SOC module 38). The SOC determining algorithm includes a current-based (or Coulomb-based) SOC component block 60, a voltage-based SOC component block 62, and a transient response-based SOC component block 64. The battery system 54 generates signals representative of various characteristics of the battery 22, such as terminal current, terminal voltage, and/or operating temperature which are sent to the SOC determining algorithm 56 which utilizes blocks 60, 62, and 64 to generate an estimation 66 of the state of charge as described below. The SOC determining algorithm 56 may also include an operational tracker to monitor the use of the motor 32 and/or the battery 34 to check the estimation 66 for obvious errors. For example, if the estimation 66 indicates that the state of charge of the battery 22 is 70% and the previous cycle indicated the state of charge was 60%, and the battery 22 has only been discharged since that time, it is very unlikely that the state of charge of the battery 22 has increased. Therefore, the most recent estimation 66 may be deemed to be inaccurate.

The determined or estimated state of charge may be expressed $$SOC = \alpha_I SOC_I + \alpha_v SOC_v + \alpha_T SOC_T, \quad (1)$$

where $SOC_I$ is a Coulomb-based (i.e., current-based) component of the state of charge, $SOC_v$ is voltage-based (e.g., open circuit voltage), $SOC_T$ is based on a transient response (e.g., pole location), and $\alpha_I$, $\alpha_v$, and $\alpha_T$ are weight (or weighting) factors for the respective state of charge components.

In one embodiment, the sensitivity (or weight) factors are first determined based on the following equations $$\alpha'_I = \frac{\partial I}{\partial SOC}, \alpha'_v = \frac{\partial \hat{V}_{oc}}{\partial SOC}, \text{ and } \alpha'_T = \frac{\partial p_i}{\partial SOC}, \quad (2)$$

where I is the current flow through the battery, $\hat{V}_{oc}$ is the calculated open circuit voltage of the battery, and $p_i$ is the dominant pole calculated in real-time. SOC is the state of charge of the battery as measured and/or set via a "cycler" (i.e., a charger/discharger), as is commonly understood. As such, each of the sensitivity factors increase as the rate of change of the respective property increases relative to a change in the state of charge.

Figures 4, 5:
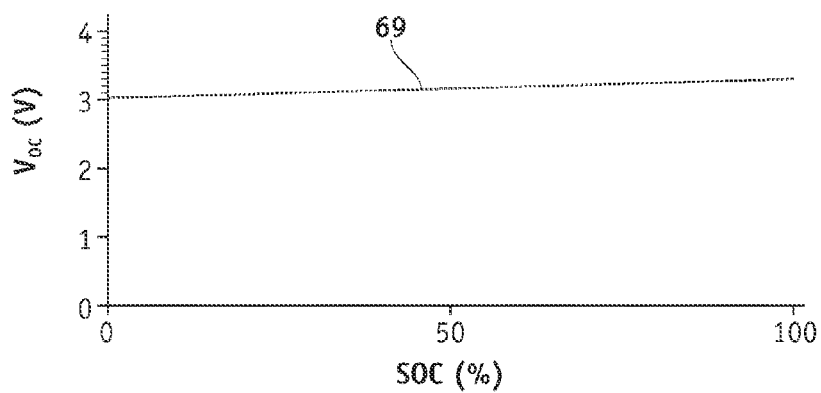
FIGS. 4-10 are exemplary tables and graphs of information that may be used in the system of FIG. 3.
Figures 7, 8:
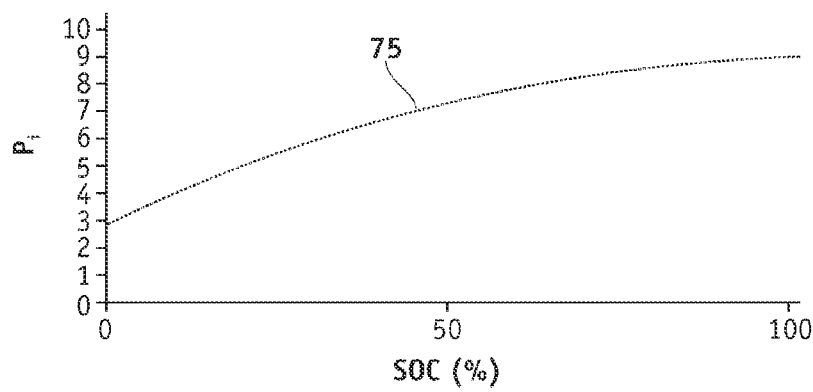

For example, referring ahead to FIGS. 5 and 8, the dominant pole position of a battery is considerably more sensitive to changes in the state of charge of the battery compared to the open circuit voltage of a battery. Specifically, as shown in FIG. 5 by line 69, the open-circuit voltage ($V_{OC}$) (at 0° C.) changes very little as the state of charge of the battery increases from 0% to 100%, and as such, the slope of the function depicted by line 69 is relatively low. In FIG. 8, as illustrated by line 75, the dominant pole position value (Pi) (at 0° C.) approximately triples as the state of charge increases from 0% to 100%. As a result, the slope of the function illustrated by line 75 is relatively high.

It should be noted that the relative values of the slopes are reversed if lines 69 and 75 are shown to illustrate the state of charge as a function of the respective properties (i.e., with the property on the x-axis and the state of charge on the y-axis). In such a case, it is those properties that generate functions with relatively low slopes, or high "inverse slopes," that are more sensitive to changes in the state of charge.

In one embodiment, a series of look up tables is generated which includes sensitivity ($\alpha'_i$ (i=I,v,T)) values for various states of charge of the battery (e.g., 10-90% SOC) at various temperatures (e.g., −45-50° C.) for each of the three properties (e.g., current, open circuit voltage, and pole location). That is, each of the sensitivity values is indicative of how much the particular property (e.g., current flow, open circuit voltage, and pole location) changes as the state of charge of the battery changes (i.e., the sensitivity of the particular property to state of charge).

These look up tables are stored, for example, within the SOC module 38 and are used to determine (or estimate) the state of charge of the battery as described below.

Using the sensitivity values, scale factors $s_{\alpha_V}$ and $s_{\alpha_T}$ and a calibratable scale factor $k_{\alpha_I}$ are first determined as $$s_{\alpha_V} = \frac{\max\{\alpha'_V, \alpha'_T\}}{\max\{\alpha'_V\}}, s_{\alpha_T} = \frac{\max\{\alpha'_V, \alpha'_T\}}{\max\{\alpha'_T\}}, 0.5 \leq k_{\alpha_I} \leq 10 \quad (3)$$

Based on Equation (3), the sensitivity values are scaled as $$\alpha''_T(i,j) = s_{\alpha_V}\alpha'_V(i,j), \alpha''_T(i,j) = s_{\alpha_T}\alpha'_T(i,j), \text{ and} $$
$$\alpha''_I(i,j) = k_{\alpha_I}\alpha'_I(i,j) \quad (4)$$

The scaled sensitivity values (e.g., $\alpha''_i$ (i=I,V,T)) are then converted to the weight factors $\alpha_I$, $\alpha_V$, and $\alpha_T$ in Equation 1 at various SOC and temperatures. The adjustment factor (k) is then calculated, which causes $\alpha_I+\alpha_V+\alpha_T=1$. The adjustment factor may be expressed $$k = \frac{1}{\alpha''_I + \alpha''_V + \alpha''_T}. \tag{5}$$

The weight factors $\alpha_I$, $\alpha_v$, and $\alpha_T$ in Equation 1 are then obtained from $$\alpha_I = k\alpha'_I, \alpha_V = k\alpha'_V, \text{ and } \alpha_T = k\alpha'_T. \tag{6}$$

FIGS. 4-10 are exemplary tables and graphs (as described above) which may be used to calculate the state of charge of the battery 22 using the methods described above. The table shown in FIG. 4 lists the various open-circuit voltages ($V_{OC}$) 66 for the battery at operating temperatures of 0° C. and 25° C., respectively, as observed at various states of charge 68.

Based on the information in FIG. 4, mathematical relationships between Voc and SOC may be generated. At 0° C., the relationship may be expressed as the following model using a least squares method $$V_{oc}(SOC)=0.9621 \cdot SOC^3-1.723 \cdot SOC^2+1.0995 \cdot SOC+3.029. \tag{7}$$

At 25° C., the model may be expressed as $$V_{oc}(SOC)=0.7910 \cdot SOC^3-1.4888 \cdot SOC^2+1.0031 \cdot SOC+3.0668. \tag{8}$$

Using Equations 2, the open circuit voltage sensitivity ($\alpha'_v$) at 0° C. may then be expressed $$\alpha'_v = 2.8863 \cdot SOC^2-3.446 \cdot SOC+1.0995, \tag{9}$$

while at 25° C. it may be expressed $$\alpha'_v = 2.373 \cdot SOC^2-2.996 \cdot SOC+1.0031. \tag{10}$$

Figure 6:

FIG. 6 illustrates an exemplary look up table that may then be generated based on the information listed in FIG. 4. The table shown in FIG. 6 lists open circuit sensitivities ($\alpha'_v$) 70 for various open-circuit voltages ($V_{OC}$) 72 at operating temperatures of 0° C. and 25° C.

FIG. 7 illustrates an exemplary look up table that lists dominate pole positions ($P_i$) 74 of the battery 22 at various states of charge 76 at operating temperatures of 25° C. and 35° C., respectively. The pole positions 74 listed in FIG. 7 may be generated using the transient-based state of charge determination method that is described below in detail.

Based on the information in FIG. 7, mathematical relationships between the pole positions and the state of charge may be generated. At 25° C., the relationship may be expressed as the following model using a least squares method $$P_i(SOC)=8.1177 \cdot SOC^3-14.044 \cdot SOC^2+12.285+SOC+2.8849. \tag{11}$$

At 25° C., the model may be expressed as $$P_i(SOC)=0.7694 \cdot SOC^3-3.1735 \cdot SOC^2+9.7527 \cdot SOC+3.8799. \tag{12}$$

Using Equations 2, the transient response-based sensitivity ($\alpha'_T$) at 25° C. may then be expressed $$\alpha'_T = 24.3531 \cdot SOC^2-28.088 \cdot SOC+12.285, \tag{13}$$

while at 35° C. it may be expressed $$\alpha'_T = 2.3082 \cdot SOC^2-6.3475 \cdot SOC+9.7527. \tag{14}$$

Figure 9:
Figure 10:

FIG. 9 illustrates an exemplary look up table that may then be generated based on the information listed in FIG. 7. The table shown in FIG. 7 lists transient response-based sensitivities ($\alpha'_T$) 78 for various dominate pole positions (Pi) 80 at operating temperatures of 25° C. and 35° C.

Scale factors ($s_{\alpha_V}, s_{\alpha_T}$) at the respective temperatures may then be calculated as $$s_{\alpha_V} = \frac{\max\{\alpha'_V \, \alpha'_T\}}{\max\{\alpha'_V\}}; s_{\alpha_T} = \frac{\max\{\alpha'_V \, \alpha'_T\}}{\max\{\alpha'_T\}} \tag{15}$$

The sensitivities $\alpha'_V$ and $\alpha'_T$ are then scaled to $\alpha''_V$ and $\alpha''_T$ by the equations $$\alpha''_V = \alpha'_V \cdot s_{\alpha_V} \text{ and } \alpha''_T = \alpha'_T \cdot s_{\alpha_T}. \tag{16}$$

Using information (at 25° C.) in the exemplary tables described herein as an example, values of $s_{\alpha_V}=11.17326$ and $s_{\alpha_T}=1$ are yielded. The table shown in FIG. 10 may be generated, which lists the sensitivities $\alpha'_V$ and $\alpha'_T$ 82 to the scaled sensitivities $\alpha''_V$ and $\alpha''_T$ 84.

In one embodiment, a calibratable weight factor $\alpha''_I$ for the current-based component (at a given temperature) and calculated $\alpha''_v$ and $\alpha''_T$ is determined using $$\alpha''_I = k_{\alpha_I} \cdot \max\{\alpha''_v, \alpha''_T\}, \tag{17}$$

where $k_{\alpha_I}$ is a calibratable parameter, generally $0.5 \leq k_{\alpha_I} \leq 10$.

The scaled sensitivities $\alpha''_I$, $\alpha''_V$ and $\alpha''_T$ as may then be summarized as $$S_\alpha = \alpha''_I + \alpha''_v + \alpha''_T \text{ and } k = \frac{1}{S_\alpha}. \tag{18}$$

The final weight factors may then be expressed $$\alpha_I = k\alpha''_I, \alpha_c = k\alpha''_v, \alpha_T = k\alpha''_T. \tag{19}$$

The weight factors are then used in Equation 1 to determine or estimate the state of charge of the battery.

As alluded to above, in one embodiment, the state of charge components used to determine (or estimate) the state of charge of the battery 22 include a Coulomb-based (i.e., current-based) component of the state of charge ($SOC_I$), a voltage-based (e.g., open circuit voltage) component ($SOC_v$), and a component ($SOC_T$) based on a transient response (e.g., pole location) of the battery.

As will be appreciated by one skilled in the art, the Coulomb-based, or current-based, component ($SOC_I$) may be generated using a method referring to generally as Ampere-hour (Ah) counting. As the charge and discharge characteristics of the battery are directly related to the supplied or withdrawn current, tracking the battery current allows for a state of charge calculation. If a starting point ($SOC_0$) is given, the value of the current integral is a direct indicator of the state of charge.

As will also be appreciated by one skilled in the art, the voltage-based component ($SOC_v$) may be generated based on the open circuit voltage of the battery, as the open circuit voltage ($V_{OC}$) monotonically relates to state of charge, according to the Nernst equation. In applications where relatively long rest periods are common, this method is promising because after all the dynamics from loaded operation decay out, the remaining battery voltage response is open circuit voltage. It is difficult to obtain the true open circuit voltage when the rest period is not long enough for the dynamics to decay, or the while the battery is under load since the dynamics in the battery terminal output voltage response tend to mask the low frequency behavior of open circuit voltage. In this case the open circuit voltage measurement has to be combined with other techniques to ensure a continuous prediction of the state of charge.

The third state of charge component ($SOC_T$), in one embodiment, is based on a transient response (e.g., pole location) of the battery and calculated according to the principles described below.

In an exemplary embodiment, a mathematical model of the battery is identified in which the dynamic components of the battery are considered as a system and described by a system equation, in which resistance and capacitance are described with a differential equation. The order of the system (i.e., the differential equation) is estimated through system identification technology based on the preliminary test data, such as hybrid pulse power characterization (HPPC) tests. The relationship between battery state of charge and system poles are established based on the HPPC test data. The parameters of the differential equation (i.e., the system parameters) are estimated in real-time by an online parameter estimation method. Based on the identified system order and estimated parameters, the system's poles, or location of the poles, are calculated, also in real-time. The pole locations correspond with the transient-response-characteristics, which are indicative of the state of charge of the battery. Therefore, the battery state of charge is determined based on the pole locations.

Figure 11:
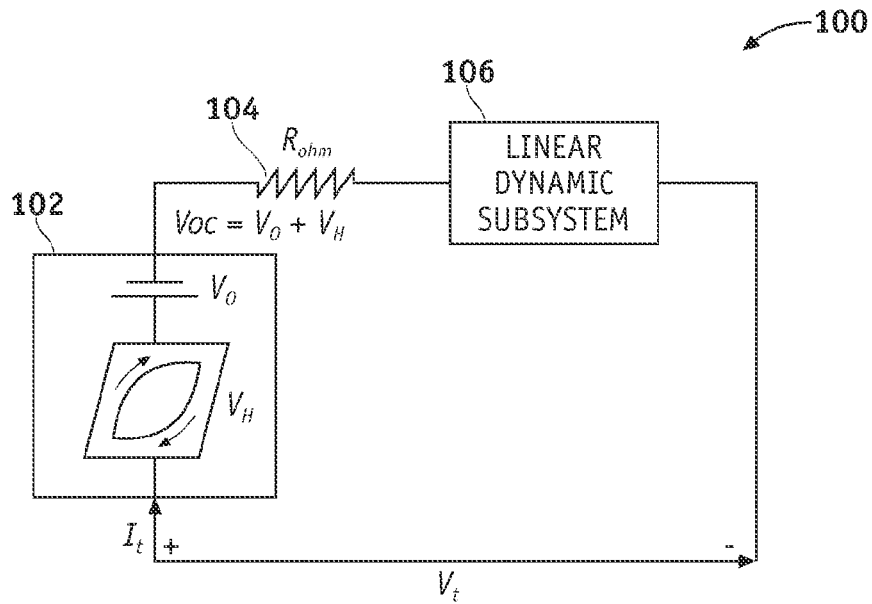
FIG. 11 is a schematic view of a dynamic model of a battery.

FIG. 11 illustrates a simplified circuit (or battery) 100 that represents a battery model according to one embodiment of the present invention. The circuit 100 includes a voltage (or power) source 102, a resistor 104, and an $n^{th}$ linear dynamic subsystem 106.

Figure 12:
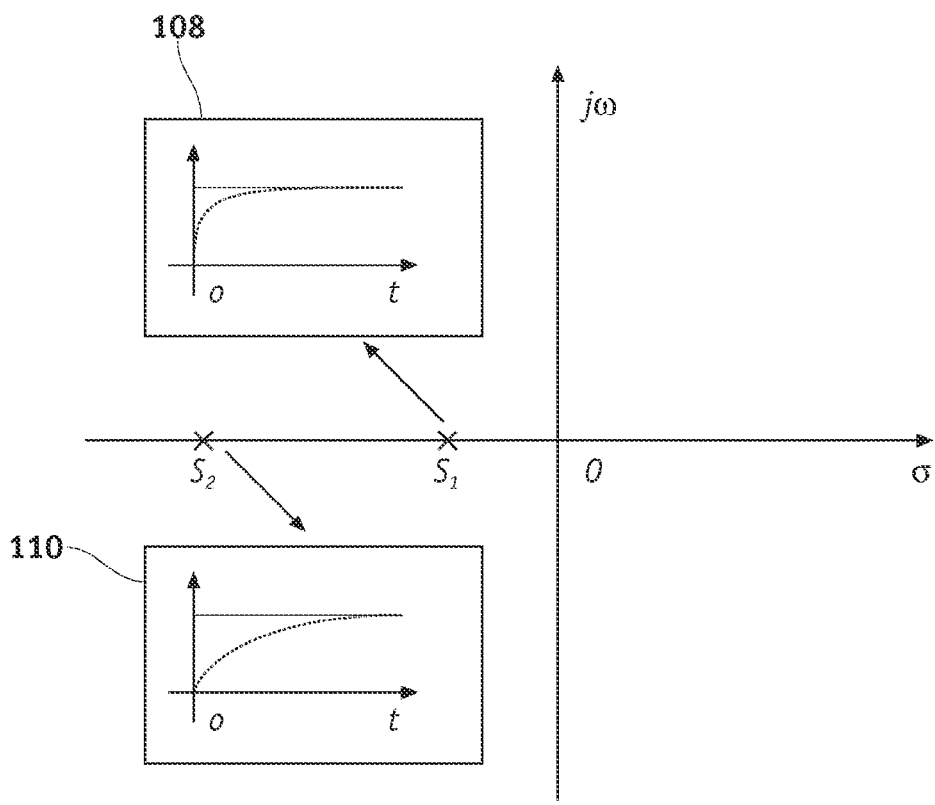
FIG. 12 is a schematic illustration of transient responses of a battery compared to locations of system poles of the battery.

Linear system theory dictates that system pole and zero locations determine the system's transient characteristics (i.e. a system's transient characteristic varies with system pole locations). FIG. 12 illustrates how the system transient response varies with pole location using an example of a first order system (i.e. a single pole system). As the state of charge of the battery changes, the battery's response to load changes also changes. In particular, as indicated in FIG. 12, at a first system pole location ($s_1$), the system exhibits a first transient response 108. At a second system pole location ($s_2$), the system exhibits a second transient response 110. As, the system pole becomes more negative, the battery achieves a state of equilibrium more slowly.

Figure 13:
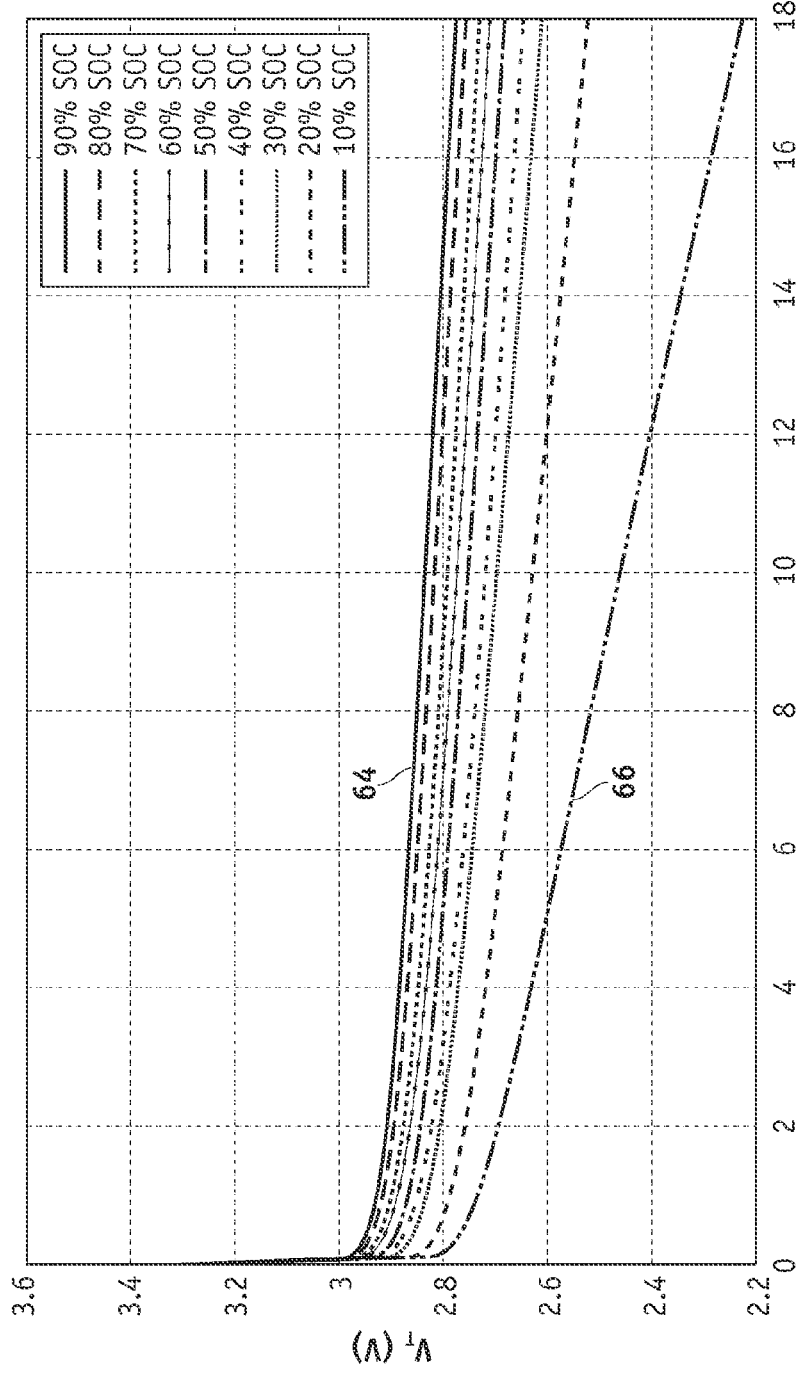
FIG. 13 is a graph useful for comparing measured terminal voltages of a battery at various states of charge (SOC) to a dynamic model.

This relationship is confirmed by FIG. 13 which graphically illustrates the terminal voltage of a nanophosphate lithium ion battery during a 100 A discharge at 25° C. at various states of charge, as determined using HPPC. The HPPC tests are performed in conjunction with the battery being coupled to a "cycler" (i.e., a charger/discharger), as is commonly understood, such that the state of charge of the battery is known and may be set to a desired value. At the extremes shown in FIG. 13, line 112 indicates that the battery achieves a state of equilibrium relatively quickly at a 90% state of charge. While line 114 indicates that the battery achieves equilibrium, relatively slowly. Thus, the locations of the system poles of the nanophosphate lithium ion battery are indicative of the state of charge of the battery.

Generally, the $n^{th}$-order linear dynamic subsystem 106 (FIG. 11) may be described by the $n^{th}$-order ordinary differential equation:

$$V(k) = a_1 * V(k-1) + a_2(t) * v(k-2) + \ldots + a_n(k-n) * V(k-n) + b_0 * I(k) + b_1 * I(k-1) + \ldots + b_m I(k-m) \quad (20)$$

or the state space equations:

$$X(k+1) = AX(k) + BI(k) \quad (21)$$

$$= \begin{bmatrix} a_{11} & a_{12} & \ldots & a_{1n} \\ a_{21} & a_{22} & \ldots & a_{2n} \\ \ldots & \ldots & \ldots & \ldots \\ a_{n1} & a_{n2} & \ldots & a_{nn} \end{bmatrix} X(k) + \begin{bmatrix} b_1 \\ b_2 \\ \ldots \\ b_n \end{bmatrix} I(k)$$

$$V(k) = CX(k) + DI(k) = [c_1 \ c_2 \ \ldots \ c_n] X(k) + d * I(k)$$

where $X(k)$ is the n×1 state vector; $I(k)$ is the input; $V(k)$ is the output; A is an n×n coefficient matrix with constant elements, $$A = \begin{bmatrix} a_{11} & a_{12} & \ldots & a_{1n} \\ a_{21} & a_{22} & \ldots & a_{2n} \\ \vdots & \vdots & & \vdots \\ a_{n1} & a_{n2} & \ldots & a_{nn} \end{bmatrix}, \quad (22)$$

B is a n×1 coefficient matrix with constant elements, $$B = \begin{bmatrix} b_1 \\ b_2 \\ \ldots \\ b_n \end{bmatrix}, \quad (23)$$

C is a 1×n coefficient matrix with constant elements, $$C = [c_1 \ c_2 \ \ldots \ c_n], \quad (24)$$

and D is a constant coefficient, $$D = d. \quad (25)$$

The order of Equation (20) or (21) may be estimated based on the preliminary test data of FIG. 13 by applying Åström's t-criterion, which may be expressed $$t(n_1, n_2) = \frac{J_1 - J_2}{J_2} \cdot \frac{N - 2n_2}{2(n_2 - n_1)}, \quad (26)$$

where N is total number of input/output data pairs and $J_1$ and $J_2$ are the values of the cost function of a parameter estimation algorithm when the system order is estimated as $n_1$ and $n_2$. If N is large enough, t asymptotically converges to $F(f_1, f_2)$-distribution, where $f_1 = 2(n_2 - n_1)$ and $f_2 = N - 2n_2$ are degrees of freedom.

After deriving the system's order, the parameters of the system may be estimated through an online estimation algorithm such as Recursive Least Squares Algorithm, Recursive Prediction-Error Method, or Kalman Filter. Equation (20) may then be expressed as the z-transfer function after obtaining the estimated parameters $$\frac{\tilde{V}(z)}{I(z)} = \frac{\hat{b}_1 z^{-1} + \hat{b}_2 z^{-2} + \ldots + \hat{b}_{m_0} z^{-m_0}}{1 + \hat{a}_1 z^{-1} + \hat{a}_2 z^{-2} + \ldots + \hat{a}_{n_0} z^{-n_0}}, \quad (27)$$

where $\tilde{V}$ is filtered terminal voltage and $I(z)$ is terminal current, $\hat{a}_i$ and $\hat{b}_i$ are estimated parameters.

Equation (27) may be rewritten in pole/zero form as $$\frac{\hat{V}(z)}{I(z)} = \frac{k(z+z_1)(z+z_2)\ldots(z+z_{m_0})}{(z+p_1)(z+p_2)\ldots(z+p_{n_0})}, \quad (28)$$

where $z_i$ and $p_j$ are system the $i^{th}$ zero and the $j^{th}$ pole, respectively.

Equation (28) may be written as $$\frac{V(z)}{I(z)} = \frac{K\prod_{i=1}^{m}(z-z_i)}{\prod_{i=1}^{n}(z-p_i)}. \quad (29)$$

In an exemplary embodiment, based on the HPPC data and Åström's criterion, the system is considered to be second order, in which case Equation (20) may be re-expressed as $$V(k) = a_1 * V(k-1) + a_2 * v(k-2) + b_0 * I(k) + b_1 * I(k-1) + b_2 I(k-2). \quad (30)$$

Given input-output data, the parameters of Equation (21) may be estimated as follows using the Recursive Least Squares Algorithm as $$\hat{\theta} = [\hat{a}_1\ \hat{a}_2\ \hat{b}_0\ \hat{b}_1\ \hat{b}_2], \quad (31)$$

where $\hat{\theta}$ is the estimation of the parameters $a_1\ a_2\ b_0\ b_1\ b_2$ in Equation (26).

The z-transfer function may then be expressed as $$\frac{V(z)}{I(z)} = \frac{\hat{b}_0 + \hat{b}_1 z^{-1} + \hat{b}_2 z^{-2}}{1 + \hat{a}_1 z^{-1} + \hat{a}_2 z^{-2}}, \quad (32)$$

Equation (32) may then be rewritten in discrete pole/zero form as $$\frac{V(z)}{I(z)} = \frac{k(z+z'_1)(z+z'_2)}{(z+p'_1)(z+p'_2)}, \quad (33)$$

When converted to the s-transfer function (continuous), Equation (23) may be expressed as $$\frac{V(s)}{I(s)} = \frac{k}{(s+p_1)(s+p_2)}, \quad (34)$$

which represents the s-function transfer form for a 2nd order battery model in a hybrid vehicle application. $p_1$ and $p_2$ should be negative; if $|p_1*10|<|p_2|$, $p_1$ is referred to as the "prime dominant pole" and $p_2$ is referred to as the "second dominant pole."

Based on test results similar to those represented in FIG. 13, as well as additional HPPC tests performed at other various temperatures (e.g., −45° C. to 40° C.), look up tables such as those shown in FIGS. 14 and 15 may be generated which are stored, for example, within the SOC module 38 (FIG. 20). Using the measured terminal voltage and current, as well as operating temperature, of the battery 22, the SOC module 38 may then determine the current state of charge of the battery using the look up tables. That is, in one embodiment, the SOC module 38 receives the terminal voltage, terminal current, and operating temperature of the battery 22 as input and generates a signal representative of the state of charge of the battery 22 based using the look up tables.

One advantage of the method and system described above is that because the state of charge of the battery is determined without using the open circuit voltage of the battery, the use of batteries with relatively invariant open circuit voltage, such as some nanophosphate lithium ion batteries, is facilitated.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for determining a state of charge of a battery comprising:
   calculating a first component of the state of charge based on a first property of the battery via a processor;
   calculating a second component of the state of charge based on a second property of the battery via the processor;
   weighting the first component of the state of charge based on a rate of change of the first property relative to a change of the state of charge via the processor;
   weighting the second component of the state of charge based on a rate of change of the second property relative to a change of the state of charge via the processor; and
   determining the state of charge based on the first and second weighted components via the processor.

2. The method of claim 1, wherein the weighting of the first component increases as the rate of change of the first property increases relative to the change of the state of charge.

3. The method of claim 2, wherein the weighting of the second component increases as the rate of change of the second property increases relative to the change of the state of charge.

4. The method of claim 1, further comprising:
   calculating a third component of the state of charge based on a third property of the battery; and
   weighting the third component of the state of charge based on a rate of change of the third property relative to the change of the state of charge,
   wherein the determining the state of charge is further based on the third weighted component.

5. The method of claim 1, further comprising:
   measuring a least one characteristic of the battery; and
   calculating the first property of the battery based on the at least one measured characteristic.

6. The method of claim 1, wherein the first property is based on a transient response of the battery.

7. The method of claim 6, wherein the first property is a location of a system pole of the battery and the weighting of the first component of the state of charge is based on a look up table comprising a plurality of determined locations of the system pole and a plurality of weighting factors, each of the weighting factors being associated with one of the determined locations of the system pole of the battery.

8. The method of claim 5, wherein the battery is an automotive battery installed in an automobile and the measuring of the at least one characteristic is performed with a sensor onboard the automobile.

9. The method of claim 1, wherein the battery is a nanophosphate lithium ion battery.

10. The method of claim 5, wherein the at least one measured characteristic comprises a terminal current of the battery, a terminal voltage of the battery, an operating temperature, and an operating temperature of the battery.

11. A method for determining a state of charge of a battery comprising:
   calculating first and second properties of the battery via a processor;
   calculating a first component of the state of charge based on the first property of the battery via the processor;
   calculating a second component of the state of charge based on the second property of the battery via the processor;
   weighting the first component of the state of charge proportionally to a rate of change of the first property relative to a change of the state of charge via the processor;
   weighting the second component of the state of charge proportionally to a rate of change of the second property relative to a change of the state of charge via the processor; and
   determining the state of charge based on the first and second weighted components via the processor.

12. The method of claim 11, wherein the weighting of the first and second components of the state of charge comprise multiplying the first and second components of the state of charge respectively by first and second weighting factors.

13. The method of claim 12, wherein the first and second weighting factors respectively increase as rates of change of the first and second properties relative to a change in the state of charge of the battery increase.

14. The method of claim 11, wherein the battery is an automotive nanophosphate lithium ion battery onboard an automobile.

15. The method of claim 11, further comprising measuring at least one of a terminal current, a terminal voltage, and an operating temperature of the battery, and wherein the calculating of the first and second properties of the battery are based on the at least one of a terminal current, a terminal voltage, and an operating temperature of the battery.

16. An automotive drive system comprising:
   an electric motor;
   a battery coupled to the electric motor;
   a sensor assembly coupled to the battery and configured to detect at least one characteristic of the battery and generate signals representative thereof; and
   a processor in operable communication with the sensor assembly and configured to:
      receive the signals from the sensor assembly;
      calculate first and second components of a state of charge of the battery based on the signals;
      weigh the first and second components of the state of charge proportionally to respective rates of change of the first and second properties relative to a change in the state of charge of the battery; and
      determine the state of charge of the battery based on the first and second weighted components.

17. The system of claim 16, wherein the calculating the first and second components of the state of charge comprises calculating first and second properties of the battery respectively based on the at least one characteristic of the battery.

18. The system of claim 17, wherein the first property is an open circuit voltage of the battery and the second property is a location of a system pole of the battery.

19. The system of claim 18, further comprising a memory in operable communication with the processor, the memory having first and second look up tables stored thereon, the first look up table comprising a plurality of determined locations of the system pole and associated weighting factors and the second look up table comprising a plurality of open circuit voltages and associated weighting factors.

20. The system of claim 19, wherein the battery is a nanophosphate lithium ion battery and the at least one measured property comprises a terminal current, a terminal voltage, and an operating temperature of the battery.

* * * * *